US008759808B2

(12) United States Patent
Nodin et al.

(10) Patent No.: US 8,759,808 B2
(45) Date of Patent: Jun. 24, 2014

(54) PHASE-CHANGE MEMORY CELL

(71) Applicants: STMicroeletronics (Crolles 2) SAS, Crolles (FR); Commissariat à l'Énergie Atomique et aux Énergies Alternatives, Paris (FR)

(72) Inventors: Jean-Francois Nodin, Quaix en Chartreuse (FR); Veronique Sousa, Grenoble (FR); Sandrine Lhostis, Theys (FR)

(73) Assignees: STMicroelectronics (Crolles 2) SAS, Crolles (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 14/018,254

(22) Filed: Sep. 4, 2013

(65) Prior Publication Data
US 2014/0070163 A1 Mar. 13, 2014

(30) Foreign Application Priority Data
Sep. 10, 2012 (FR) ...................................... 12 58472

(51) Int. Cl.
*H01L 45/00* (2006.01)
(52) U.S. Cl.
USPC ..... 257/2; 257/1; 257/3; 257/5; 257/E45.001; 257/E45.002
(58) Field of Classification Search
CPC ......... H01L 45/00; H01L 45/04; H01L 45/06; H01L 45/141; H01L 45/144
USPC ............ 257/2–5, E47.001, E45.001, E45.002
See application file for complete search history.

(56) References Cited

U.S. PATENT DOCUMENTS

| 7,550,313 | B2 | | 6/2009 | Arnold et al. |
| 7,615,770 | B2 | * | 11/2009 | Philipp et al. ...................... 257/2 |
| 7,663,909 | B2 | * | 2/2010 | Philipp et al. ................. 365/163 |
| 7,701,750 | B2 | * | 4/2010 | Shih et al. ...................... 365/148 |
| 7,719,886 | B2 | * | 5/2010 | Philipp et al. ................. 365/163 |
| 7,859,893 | B2 | * | 12/2010 | Liu et al. ........................ 365/163 |
| 7,973,384 | B2 | * | 7/2011 | Happ et al. ...................... 257/529 |
| 8,124,950 | B2 | * | 2/2012 | Happ et al. ......................... 257/2 |
| 2009/0180314 | A1 | * | 7/2009 | Liu ................. 365/163 |
| 2009/0278107 | A1 | * | 11/2009 | Kim et al. ......................... 257/2 |
| 2010/0283029 | A1 | | 11/2010 | Dennison et al. |

(Continued)

OTHER PUBLICATIONS

French Search Report and Written Opinion dated May 16, 2013 from corresponding French Patent Application No. 12/58472.

*Primary Examiner* — Allison P Bernstein
(74) *Attorney, Agent, or Firm* — Wolf, Greenfield & Sacks, P.C.

(57) ABSTRACT

A memory cell including a via made of a phase-change material arranged between a lower electrode and an upper electrode, wherein the via includes a first region adjacent to a second region itself adjacent to at least one third region, the first, second, and third regions each extending from the upper electrode to the lower electrode, the crystallization temperature of the second region ranging between that of the first region and that of the third region, and the melting temperatures of the first, second, and third regions being substantially identical.

12 Claims, 4 Drawing Sheets

(56) References Cited

U.S. PATENT DOCUMENTS

2010/0314601 A1* 12/2010 Lee .................................. 257/4
2011/0049456 A1* 3/2011 Lung et al. ....................... 257/2
2011/0155992 A1* 6/2011 Kao et al. ......................... 257/4

* cited by examiner

PHASE-CHANGE MEMORY CELL

CROSS REFERENCE TO RELATED APPLICATIONS

This application claims the priority benefit of French patent application serial number 12/58472, filed on Sep. 10, 2012, which is hereby incorporated by reference to the maximum extent allowable by law.

BACKGROUND

1. Technical Field

The present disclosure relates to a phase-change random access memory cell or PCRAM cell. The present disclosure also relates to a method for manufacturing such PCRAM cells.

2. Discussion of the Related Art

PCRAMs use materials called phase-change materials, which are capable of changing from a crystal phase to an amorphous phase and conversely, the crystal phase being conductive and the amorphous phase being poorly conductive. Such phase-change materials, for example, are chalcogenides. The conductivities of the crystal phase and of the amorphous phase of such materials may be by a high ratio, from $10^3$ to $10^6$.

Existing PCRAM structures used in multi-level programming mode have a long write time.

SUMMARY

An embodiment provides a PCRAM cell enabling to perform multi-level programming, at least partly overcoming some of the disadvantages of existing PCRAM cell structures.

An embodiment provides a memory cell comprising a via made of a phase-change material arranged between a lower electrode and an upper electrode, the via comprising a first region adjacent to a second region, itself adjacent to at least one third region. The first, second, and third regions each extend from the upper electrode to the lower electrode, the crystallization temperature of the second region ranging between that of the first region and that of the third region, and the melting temperatures of the first, second, and third regions being substantially identical.

According to an embodiment, the first region is a central region of the via surrounded with the second region, itself surrounded with the third region.

According to an embodiment, the via made of a phase-change material has a height ranging between 30 and 100 nm and lateral dimensions ranging between 100 and 300 nm, and the widths of the first, second, and third regions are identical.

According to an embodiment, the second region has received an implantation of first species and the third region has received an implantation of second species.

According to an embodiment, the phase-change material is a germanium telluride and the first and second species respectively are nitrogen and carbon.

According to an embodiment, the via made of phase-change material is laterally surrounded with an insulating material.

According to an embodiment, a first barrier layer is interposed between the lower electrode and the phase-change material, and a second barrier layer is interposed between upper electrode and the phase-change material.

According to an embodiment, the via made of phase-change material further comprises at least one fourth region adjacent to the third region, the crystallization temperature of the at least one fourth region being higher than that of the third region, and the melting temperature of the at least one fourth region being substantially identical to that of the third region.

An embodiment further provides a method for manufacturing a memory cell, comprising the steps of a) forming an opening in an insulating layer covering a first electrode formed on a substrate; b) filling the opening with a phase-change material to form a via; c) implanting first species in a second region of the via surrounding a first region of the via and in a third region of the via surrounding the second region, so that the crystallization temperature of the second region is higher than that of the first region and that the melting temperature of the second region is substantially identical to that of the first region; d) implanting second species only in the third region of the via so that the crystallization temperature of the third region is greater than that of the second region and that the melting temperature of the third region is substantially identical to that of the second region; and e) covering the via with a second electrode.

According to an embodiment, at step b), the opening is filled with a germanium telluride; at step c), nitrogen is implanted into the second and third regions; and at step d), carbon is implanted into the third region.

An embodiment further provides a method for using a memory cell of the above-described type, comprising the successive steps of making amorphous at least a portion of the first region and at least a portion of the second and third regions of the via made of phase-change material; making the first region totally crystalline; making the second region totally crystalline; and making the third region totally crystalline.

The foregoing and other features and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of microelectronic components, the various drawings are not to scale.

DETAILED DESCRIPTION

Figure 1:
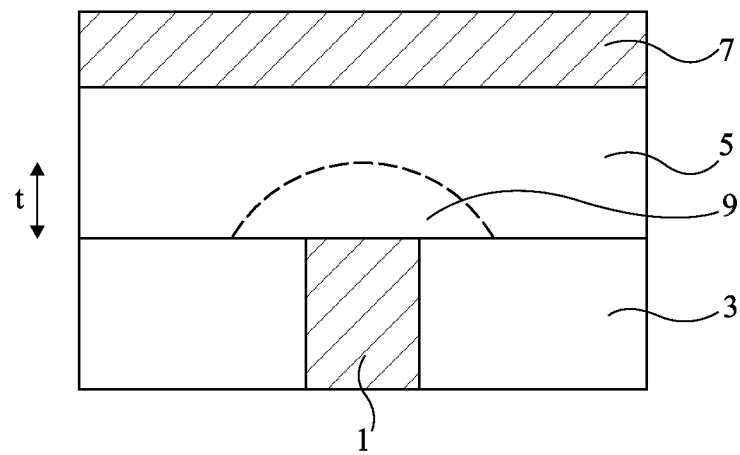
FIG. 1 is a cross-section view schematically showing an example of PCRAM cell.

FIG. 1 is a cross-section view schematically showing a conventional example of PCRAM cell.

A substrate, not shown, supports an electrode 1 surrounded with an insulating material 3. A phase-change material 5 covers electrode 1 and insulating material 3. Phase-change material 5 is covered with an electrode 7. Electrodes 1 and 7 have different dimensions, electrode 1 being narrower than electrode 7.

Such a PCRAM cell operates as follows.

An initial state in which phase-change material 5 is crystalline (conductive) is considered.

To pass from this conductive state to a resistive state, a short high voltage pulse is applied between the two electrodes 1 and 7. This causes a heating by Joule effect of phase-change material 5. Phase-change material 5 reaches its melting temperature in a region 9, delimited by dotted lines, close to smaller electrode 1. Region 9 of phase-change material 5 melts, and then cools down in the amorphous (resistive) state.

To pass from the resistive state to the conductive state, a long low-voltage pulse is applied between the two electrodes 1 and 7. This causes a heating by Joule effect of phase-change material 5, which reaches its crystallization temperature in region 9. Region 9 of phase-change material 5 crystallizes and becomes conductive again.

In conventional programming mode, which corresponds to the above-described operating mode, only two programming levels are used. One level corresponds to the state called conductive, where phase-change 5 is totally crystalline. The other level corresponds to the state called resistive, where a region close to smallest electrode 1 of phase-change material 5 is amorphous (region 9).

Such PCRAM cells capable of being used to perform multi-level programming have also been provided. An example of such PCRAM cells is described in article "Multilevel Phase-Change Memory Modeling and Experimental Characterization", A. Pantazi et al., pp. 34-41, EPCOS 2009. Intermediate states between the conductive state and the resistive state are then used. By varying thickness t of amorphous region 9 of phase-change material 5, different resistance values ranging between the lowest value corresponding to the conductive state and the highest value corresponding to the resistive state are obtained.

In a PCRAM cell of the type illustrated in FIG. 1 used in multi-level programming mode, differences can be observed between the resistance value obtained for a level and the value which should have been expected. This can especially be explained by differences due to the manufacturing process between two cells designed to be identical, or by fluctuations of the characteristics of the phase-change material in a same cell. The write and read steps then have to be resumed until the targeted resistance value can be obtained. This results in increasing the write time.

Figure 2:
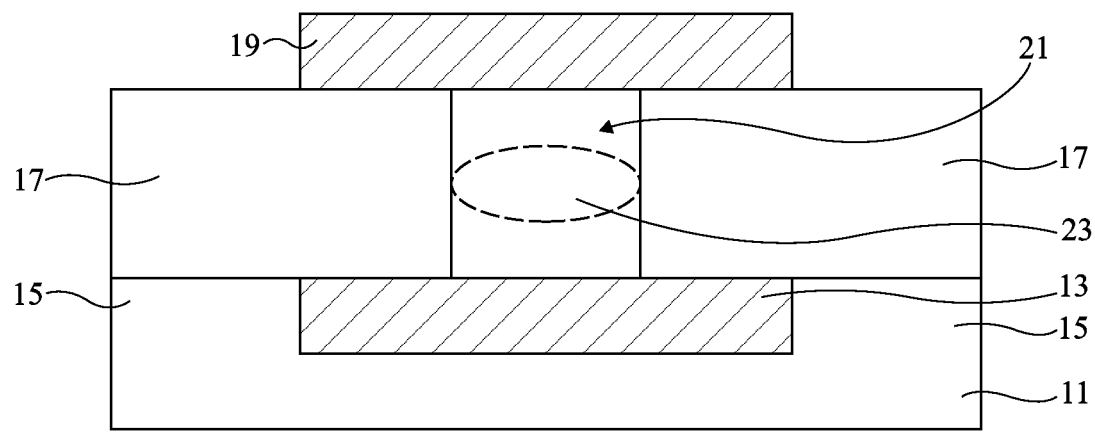
FIG. 2 is a cross-section view schematically showing a confined two-state PCRAM cell.

FIG. 2 is a cross-section view schematically showing an example of a so-called two-state confined PCRAM cell.

A substrate, not shown, for example, made of silicon, supports an insulating layer 11 coated with a conductive layer 13 surrounded with an insulating material 15. Conductive layer 13 and insulating material 15 are covered with an insulating layer 17, itself covered with a conductive layer 19. A via 21 made of phase-change material crosses insulating layer 17 and extends from conductive layer 19 to conductive layer 13.

Conductive layers 13 and 19 respectively form the lower and upper electrodes of the PCRAM cell. Via 21 made of phase-change material forms the active area of the cell. In such a PCRAM cell, electrodes 13 and 19 have the same dimension.

The operation of this confined PCRAM cell is similar to that of the PCRAM cell illustrated in FIG. 1, except for the fact that, if electrodes 13 and 19 are of the same dimension, the region of phase-change material 21 which passes from the crystal phase to the amorphous phase and conversely, delimited by dotted lines and designated with reference numeral 23, is located substantially at equal distance from electrodes 13 and 19. Further, region 23 extends over the entire horizontal section of via 21.

The inventors provide transforming a two-state confined PCRAM cell of the type illustrated in FIG. 2 into a multi-level cell. To achieve this, they provide implanting species in the phase-change material via to obtain at least three adjacent regions of different crystallization temperatures.

Figure 3:
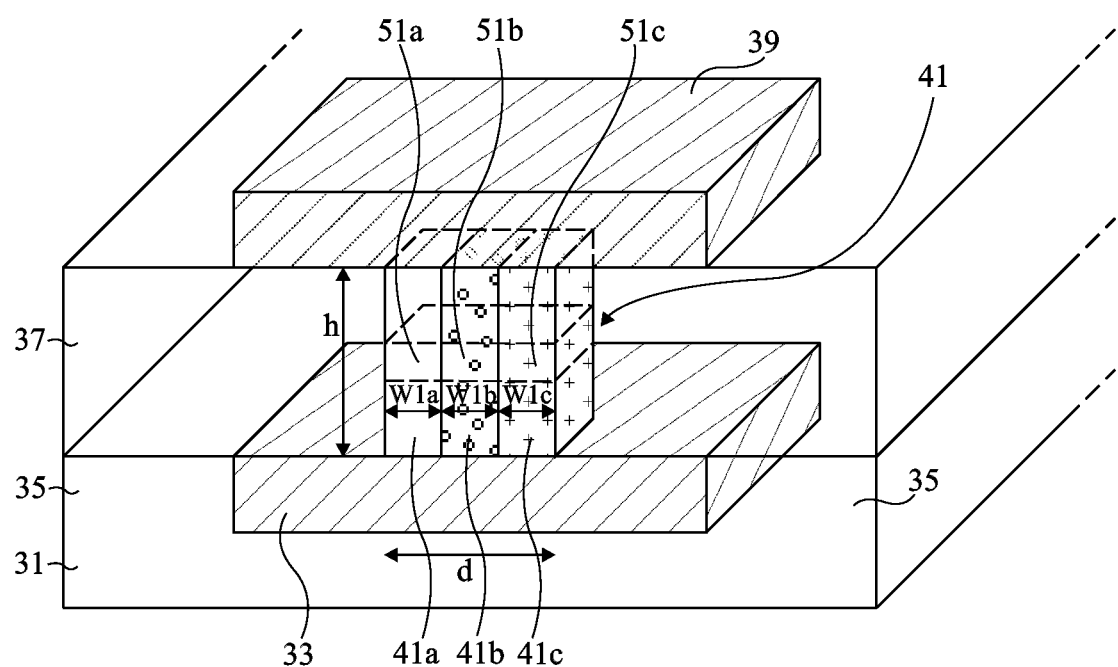
FIG. 3 is a cross-section perspective view schematically showing a confined multi-level PCRAM cell.

FIG. 3 is a cross-section perspective view schematically showing a confined multi-level PCRAM cell.

A substrate, not shown, for example made of silicon, supports an insulating layer 31 coated with a conductive layer 33 surrounded with an insulating material 35. Conductive layer 33 and insulating material 35 are covered with an insulating layer 37, itself covered with a conductive layer 39. A via 41 made of phase-change material crosses insulating layer 37 and extends from conductive layer 39 to conductive layer 33. Conductive layers 33 and 39 respectively form the lower and upper electrodes of the PCRAM cell. Via 41 for example has a square or rectangular cross-section.

Via 41 made of phase-change material comprises three adjacent regions 41a, 41b, and 41c, region 41b being arranged between regions 41a and 41c. Species have been implanted in region 41b so that its crystallization temperature is, for example, higher than that of region 41a. Other species have been implanted in region 41c so that its crystallization temperature is for example higher than that of region 41b. The species have been implanted so that the melting temperatures of regions 41b and 41c having received a species implantation are substantially identical to those of region 41a having received no species implantation.

As shown, the respective widths W1a, W1b, and W1c of regions 41a, 41b, and 41c are for example substantially identical.

Figure 4:
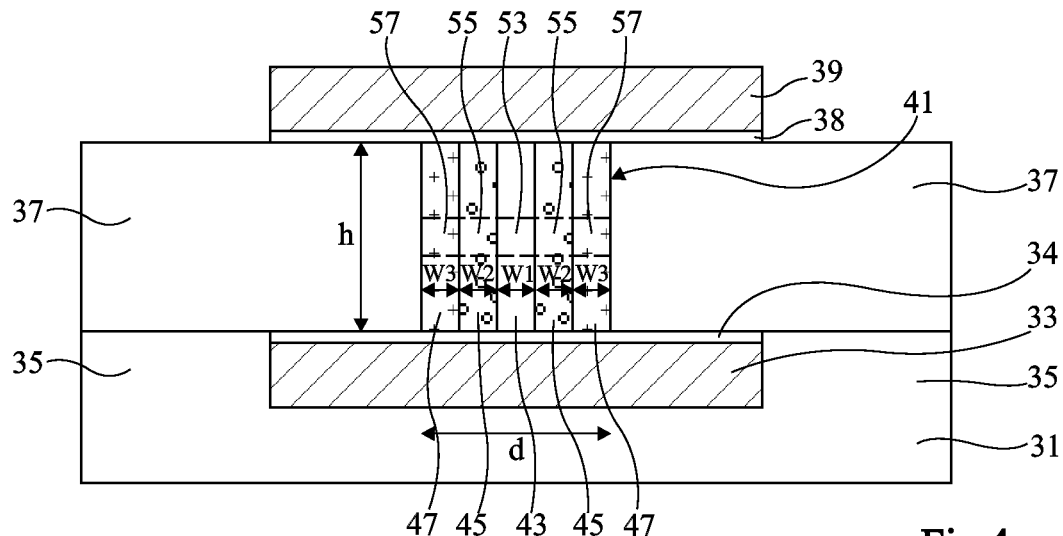
FIG. 4 is a cross-section view schematically showing a variation of a multi-level confined PCRAM cell.

FIG. 4 is a cross-section view schematically showing a variation of the confined multi-level PCRAM cell of FIG. 3. In this variation, the inventors provide implanting species in the phase-change material via to obtain concentric peripheral regions surrounding a central region, the crystallization temperature of a peripheral region being higher than that of the peripheral region that it surrounds and higher than that of the central region. The elements common with those of the confined multi-level PCRAM cell of FIG. 3 are designated with the same reference numerals.

In this variation, via 41 made of phase-change material for example has a circular, square, or rectangular cross-section. Advantageously, barrier layers 34 and 38 are respectively interposed between conductive layer 33 and insulating layer 37 and between conductive layer 39 and insulating layer 37. Barrier layers 34 and 38 are intended to prevent the diffusion of metals from electrodes 33 and 39 to phase-change material 41 and insulating layer 37. Barrier layers may also be provided in a confined multi-level PCRAM cell of the type illustrated in FIG. 3.

Via 41 made of phase-change material comprises a central region 43 surrounded with a peripheral region 45, itself surrounded with another peripheral region 47. Species have been implanted in peripheral region 45 so that its crystallization temperature is higher than that of central region 43. Other species have been implanted in peripheral region 47 so that its crystallization temperature is higher than that of peripheral region 45. The species have been implanted so that the melting temperatures of peripheral regions 45 and 47 are substantially identical to that of central region 43.

As shown, the respective widths W1, W2, and W3 of central region 43 and of peripheral regions 45 and 47 are for example substantially identical.

The operation of a confined multi-level PCRAM cell of the type illustrated in FIGS. 3 and 4 is the following.

An initial state where region 41a, 43 and region 41b, 45 and 41c, 47 of phase-change material via 41 are totally crystalline (conductive) is considered.

To pass from this initial conductive state to a first (resistive) state, a short high-voltage pulse is applied between electrodes 33 and 39, so that region 41a, 43 and regions 41b, 45 and 41c, 47 of via 41 each reach their melting temperature (which are substantially identical). A portion 51a, 53 of region 41a, 43, a portion 51b, 55 of region 41b, 45, and a portion 51c, 57 of region 41c, 47, located substantially at equal distance from the two electrodes 33 and 39, melt, and then cool down in the amorphous state. Portions 51a, 51b, 51c and 53, 55, and 57 which change state are delimited by dotted lines, respectively in FIGS. 3 and 4.

To pass from this first resistive state to a second less resistive state, a long low-voltage pulse is applied between electrodes 33 and 39, so that central region 41a, 43 of via 41 reaches its crystallization temperature, unlike regions 41b, 45, 41c, 47 which have a higher crystallization temperature. Portion 51a, 53 of region 41a, 43 of via 41 crystallizes. In the second state, region 41a, 43 of via 41 is totally crystalline.

To pass from this second state to a third still less resistive state, a new long low-voltage pulse is applied between electrodes 33 and 39. Region 41a, 43 of via 41, which is totally crystalline (conductive), heats up, which causes a heating of region 41b, 45 of via 41 in contact with region 41a, 43. Region 41b, 45 of via 41 reaches its crystallization temperature, but not region 41c, 47 which has a higher crystallization temperature. Portion 51b, 55 of region 41b, 45 of via 41 crystallizes. In the third state, region 41a, 43 and region 41b, 45 of via 41 are totally crystalline.

To pass from this third low-resistance state to a fourth conductive state, a new long low-voltage pulse is applied between electrodes 33 and 39. Region 41a, 43 and region 41b, 45 of via 41, which are totally crystalline (conductive), heat up, which causes a heating of region 41c, 45 of via 41 in contact with region 41b, 45. Region 41c, 47 of via 41 reaches its crystallization temperature. Portion 51c, 57 of region 41c, 47 of via 41 crystallizes. In the fourth state, region 41a, 43 and regions 41b, 45 and 41c, 47 of via 41 are totally crystalline. Via 41 is totally crystalline.

In a confined multi-level PCRAM cell of the type illustrated in FIGS. 3 and 4, four well-defined resistance levels corresponding to the four above-described states are obtained. It is thus not necessary to resume the write and read steps to verify that the targeted resistance value has been reached.

It will be within the abilities of those skilled in the art to select widths W1 (W1a), W2 (W1b), and W3 (W1c) of regions 43 (41a), 45 (41b), and 47 (41c) to obtain four well-defined resistance levels.

An advantage of a confined multi-level PCRAM cell of the type illustrated in FIGS. 3 and 4 is its simple operation in multi-level programming mode.

As an example of materials and of dimensions, electrodes 33 and 39 are for example made of aluminum silicide (AlSi) and for example have a thickness ranging between 50 and 500 nm. The barrier layers are for example made of titanium nitride (TiN) and for example have a thickness ranging between 5 and 50 nm. Insulating layers 31, 35, and 37 are for example made of silicon oxide.

The thickness of insulating layer 37, and thus height h of via 41, for example ranges between 30 and 100 nm and for example is on the order of 50 nm. Lateral dimensions d of via 41 (diameter d of via 41 in the case where the via has a circular cross-section) for example range between 100 and 300 nm, and for example are on the order of 150 nm.

In the case of a confined multi-level PCRAM cell of the type illustrated in FIG. 4, for a via 41 having a diameter d ranging between 100 and 300 nm, widths W1, W2, and W3 for example range between 20 and 60 nm.

According to an embodiment, phase-change material 41 is a germanium telluride, for example, $Ge_{0.5}Te_{0.5}$, and its crystallization temperature is approximately 180° C. Region 41b, 45 has received a nitrogen implantation and its crystallization temperature is approximately 275° C. Region 41c, 47 has received a carbon implantation and its crystallization temperature is approximately 370° C.

FIGS. 5A to 5D are cross-section views schematically illustrating successive steps of a method for manufacturing a confined multi-level PCRAM cell of the type illustrated in FIG. 4.

Figure 5A:
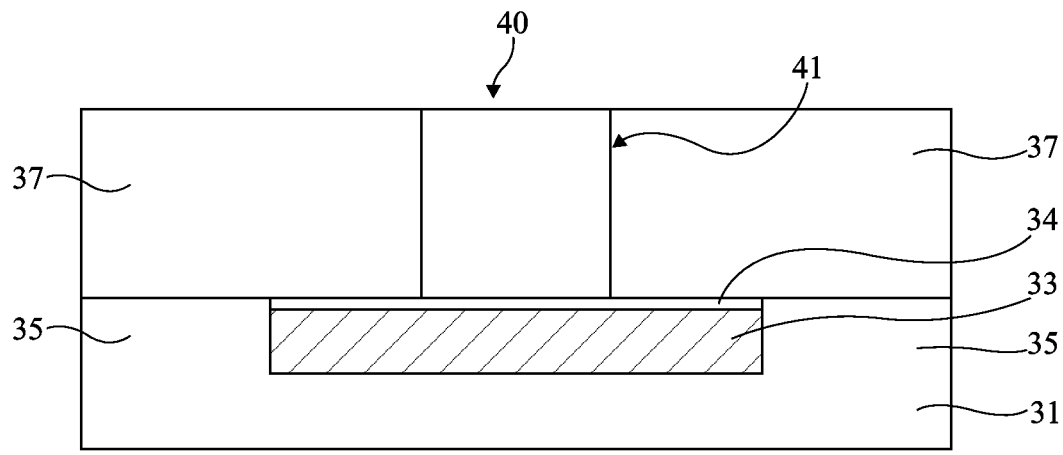
FIGS. 5A to 5D are cross-section views schematically illustrating successive steps of a method for manufacturing the multi-level confined PCRAM cell of FIG. 4.

FIG. 5A shows insulating layer 31 (supported by a substrate, not shown) coated with conductive layer 33, for example, made of AlSi, itself covered with barrier layer 34, for example, made of TiN. Layers 33 and 34 are surrounded with insulating material 35. Conductive layer 33 forms the lower electrode of the confined multi-level PCRAM cell being formed.

Barrier layer 34 and insulating material 35 have been covered with insulating layer 37. An opening 40 has been formed in insulating layer 37, from the upper surface of insulating layer 37 all the way to barrier layer 34. Opening 40 has been filled with a phase-change material, for example, a germanium telluride, for example, $Ge_{0.5}Te_{0.5}$, to form via 41. To achieve this, the phase-change material has for example been deposited by a PVD method. A chemical mechanical polishing (CMP) has for example then been performed, so that the upper surface of via 41 made of phase-change material is flush with the upper surface of insulating layer 37.

Figure 5B:
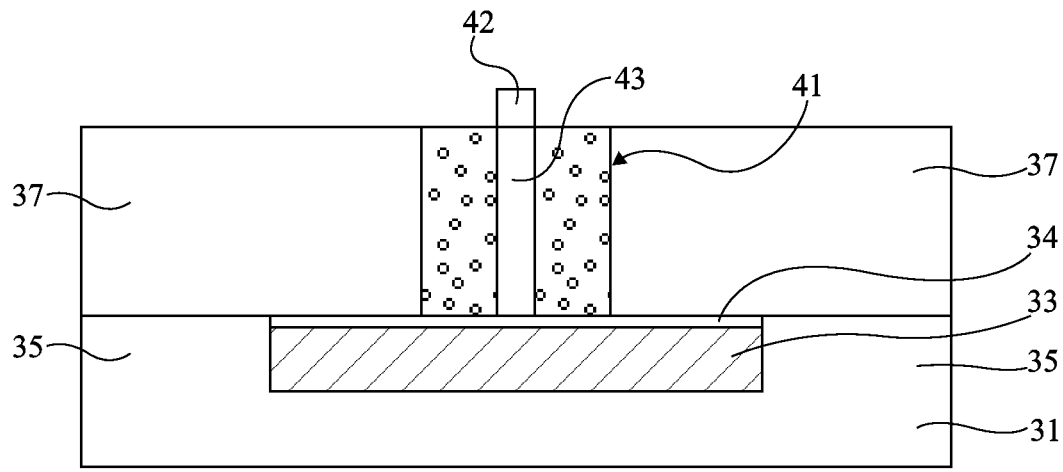

In FIG. 5B, species have been implanted in via 41 made of phase-change material, except in a central region 43 of via 41. For this purpose, a mask 42 has been previously arranged above central region 43 of via 41. The species and the implantation conditions are selected so that, after the implantation, the crystallization temperature of central region 43 of via 41 is lower than that of the rest of via 41, and so that the melting temperature of central region 43 is substantially identical to that of the rest of via 41. The implanted species are, for example, nitrogen.

Figure 5C:
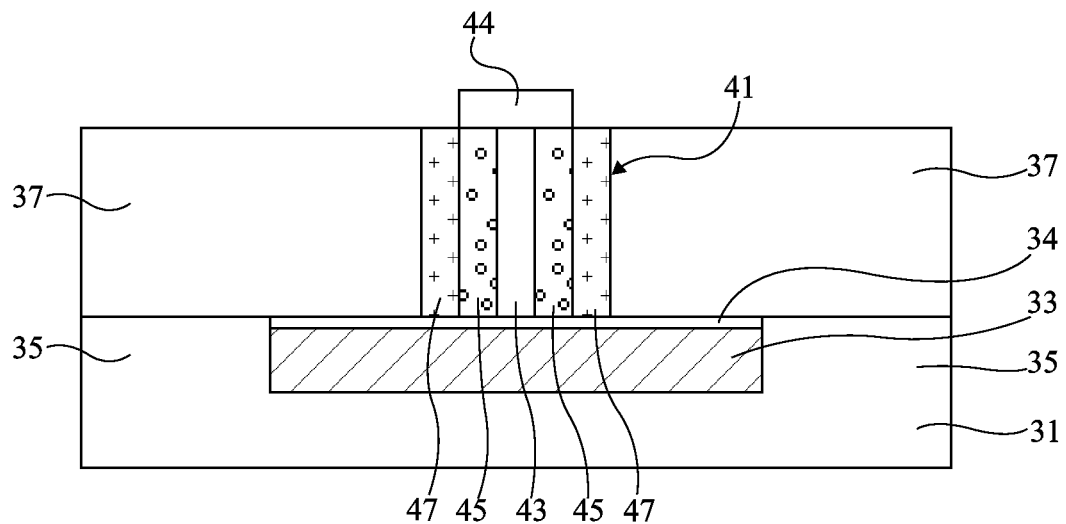

In FIG. 5C, other species have been implanted in peripheral region 47 of via 41. To achieve this, a mask 44 has been previously arranged above central region 43 and above peripheral region 45 of via 41 surrounding central region 43 where no species are desired to be implanted. The species and implantation conditions are selected so that, after implantation, the crystallization temperature of peripheral region 47 is higher than that of peripheral region 45, which is itself higher than that of central region 43, and so that the melting temperature of peripheral region 47 is substantially identical to those of peripheral region 45 and of central region 43. The implanted species are for example carbon.

Figure 5D:
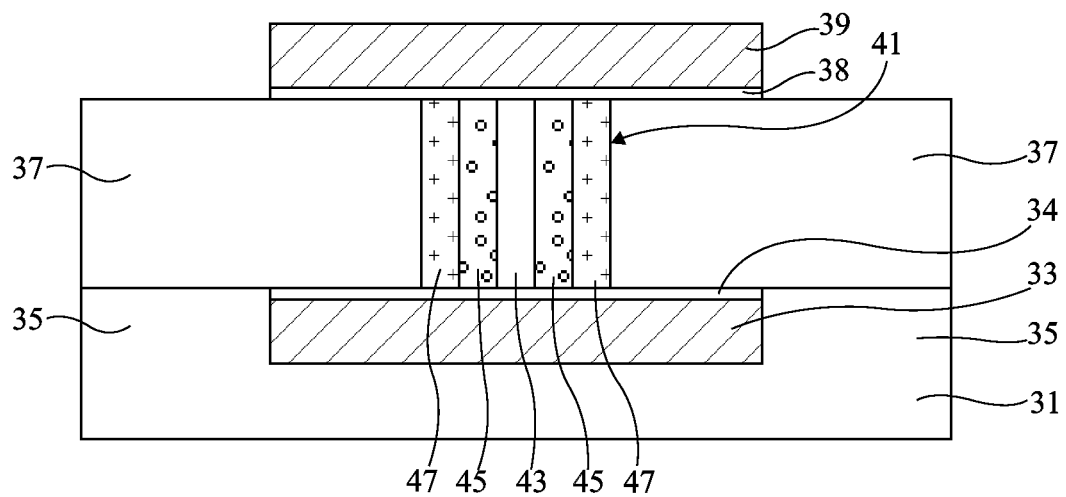

In FIG. 5D, a stack formed of barrier layer 38, for example, made of TiN, and of conductive layer 39, for example, made of AlSi, has been formed above via 41 made of phase-change material and above portions of insulating layer 37 surrounding via 41. Conductive layer 39 forms the upper electrode of the confined multi-level PCRAM cell.

A similar method may be used to manufacture a confined multi-level PCRAM cell of the type illustrated in FIG. 3. It will be within the abilities of those skilled in the art to use adapted masks to form regions 41a, 41b, and 41c of different crystallization temperatures.

Specific embodiments of the present invention have been described. Various alterations, modifications, and improvements will readily occur to those skilled in the art.

In particular, although a confined multi-level PCRAM cell comprising a via made of a germanium telluride has been described, any phase-change material having its crystallization temperature capable of being increased by implantation of species while substantially keeping the same melting temperature may be used.

Further, although two variations of a confined multi-level PCRAM cell having its phase-change material via comprising a first region adjacent to a second region, itself adjacent to a third region have been described, the phase-change material via may of course comprise more than three regions having different crystallization temperatures. Thus, the confined multi-level PCRAM cell will be adapted to the programming of more than four states, corresponding to more than four well-defined resistance levels.

Although a confined multi-level PCRAM cell having its phase-change material via comprising a first region adjacent to a second region, itself adjacent to a third region, with the crystallization temperature of the second region ranging between that of the first region and that of the third region, has been described, the crystallization temperatures of the first, second, and third regions may be arranged in another order.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory cell comprising a via made of a phase-change material arranged between a lower electrode and an upper electrode, wherein the via comprises a first region adjacent to a second region itself adjacent to at least one third region, the first, second, and third regions each extending from the upper electrode to the lower electrode, the crystallization temperature of the second region ranging between that of the first region and that of the third region, and the melting temperatures of the first, second, and third regions being substantially identical.

2. The memory cell of claim 1, wherein the first region is a central region of the via surrounded with the second region, itself surrounded with the third region.

3. The memory cell of claim 1, wherein the via made of a phase-change material has a height ranging between 30 and 100 nm and lateral dimensions ranging between 100 and 300 nm, and wherein the widths of the first, second, and third regions are identical.

4. The memory cell of claim 1, wherein the second region has received an implantation of first species and wherein the third region has received an implantation of second species.

5. The memory cell of claim 4, wherein the phase-change material is a germanium telluride and wherein the first and second species respectively are nitrogen and carbon.

6. The memory cell of claim 1, wherein the via made of phase-change material is laterally surrounded with an insulating material.

7. The memory cell of claim 1, wherein a first barrier layer is interposed between the lower electrode and the phase-change material, and wherein a second barrier layer is interposed between the upper electrode and the phase-change material.

8. The memory cell of claim 1, wherein the via made of phase-change material further comprises at least one fourth region adjacent to the third region, the crystallization temperature of the at least one fourth region being higher than that of the third region, and the melting temperature of the at least one fourth region being substantially identical to that of the third region.

9. A method for manufacturing a memory cell, comprising the steps of:
  a) forming an opening in an insulating layer covering a first electrode formed on a substrate;
  b) filling the opening with a phase-change material to form a via;
  c) implanting first species in a second region of the via surrounding a first region of the via and in a third region of the via surrounding the second region, so that the crystallization temperature of the second region is higher than that of the first region and that the melting temperature of the second region is substantially identical to that of the first region;
  d) implanting second species only in the third region of the via so that the crystallization temperature of the third region is greater than that of the second region and that the melting temperature of the third region is substantially identical to that of the second region; and
  e) covering the via with a second electrode.

10. The method of claim 9, wherein:
at step b), the opening is filled with a germanium telluride;
at step c), nitrogen is implanted in the second and third regions; and
at step d), carbon is implanted in the third region.

11. A method for using the memory cell of claim 1, comprising the steps of:
  making amorphous at least a portion of the first region and at least a portion of the second and third regions of the via made of phase-change material;
  making the first region totally crystalline;
  making the second region totally crystalline; and
  making the third region totally crystalline.

12. The method of claim 11, wherein the steps are performed successively.

* * * * *